United States Patent
Wang et al.

(10) Patent No.: US 12,041,795 B2
(45) Date of Patent: Jul. 16, 2024

(54) THIN FILM TRANSISTOR AND METHOD FOR MANUFACTURING THE SAME, DISPLAY DEVICE

(71) Applicant: BOE TECHNOLOGY GROUP CO., LTD., Beijing (CN)

(72) Inventors: Lizhong Wang, Beijing (CN); Tianmin Zhou, Beijing (CN); Yupeng Gao, Beijing (CN); Ning Dang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 530 days.

(21) Appl. No.: 17/427,556

(22) PCT Filed: Dec. 29, 2020

(86) PCT No.: PCT/CN2020/140893
§ 371 (c)(1),
(2) Date: Jul. 30, 2021

(87) PCT Pub. No.: WO2021/184910
PCT Pub. Date: Sep. 23, 2021

(65) Prior Publication Data
US 2022/0320449 A1    Oct. 6, 2022

(30) Foreign Application Priority Data

Mar. 18, 2020   (CN) .................... 202010191972.9

(51) Int. Cl.
*H10K 10/46*      (2023.01)
*H01L 29/66*      (2006.01)
(Continued)

(52) U.S. Cl.
CPC ......... *H10K 10/484* (2023.02); *H10K 59/125* (2023.02)

(58) Field of Classification Search
CPC ............... H10K 10/486; H10K 59/125; H10K 59/1201; H10K 77/111; H01L 29/78618; H01L 29/66742
See application file for complete search history.

(56) References Cited

U.S. PATENT DOCUMENTS 7,629,633 B2    12/2009   Chan
2006/0175609 A1  8/2006   Chan
(Continued)

FOREIGN PATENT DOCUMENTS

CN    103022150 A    4/2013
CN    104253156 A    12/2014
(Continued)

OTHER PUBLICATIONS

China Patent Office, First Office Action issued Jan. 28, 2021 for application No. CN202010191972.9.

*Primary Examiner* — Mohsen Ahmadi
(74) *Attorney, Agent, or Firm* — HOUTTEMAN LAW LLC

(57) ABSTRACT

A thin film transistor, a method for manufacturing the same and a display device are disclosed, the thin film transistor includes: a first electrode, a second electrode, an active layer and a flexible conductive layer located on a substrate, one of the first electrode and the second electrode is a source, and the other thereof is a drain; the active layer is electrically coupled with the first electrode, and an orthographic projection of the active layer on the substrate is within an orthographic projection of the first electrode on the substrate; the flexible conductive layer is located on a side of the active layer away from the first electrode, and electrically couples the active layer with the second electrode.

14 Claims, 8 Drawing Sheets

(51) Int. Cl.
*H01L 29/786* (2006.01)
*H10K 59/12* (2023.01)
*H10K 59/125* (2023.01)
*H10K 77/10* (2023.01)

(56) References Cited

U.S. PATENT DOCUMENTS

| | | | | |
|---|---|---|---|---|
| 2015/0014868 A1* | 1/2015 | Choi | ................... | G02F 1/13394 |
| | | | | 257/797 |
| 2015/0303388 A1* | 10/2015 | Shi | ...................... | H01L 27/1218 |
| | | | | 427/579 |
| 2015/0311232 A1* | 10/2015 | Sun | ..................... | H01L 27/1222 |
| | | | | 257/72 |
| 2015/0333115 A1* | 11/2015 | Yang | ....................... | H01L 21/77 |
| | | | | 438/23 |
| 2017/0358642 A1* | 12/2017 | Jo | ........................... | H01L 25/18 |
| 2019/0140100 A1* | 5/2019 | Wang | ................ | H01L 29/78606 |
| 2019/0163238 A1* | 5/2019 | Zhang | ................... | G06F 1/1652 |

FOREIGN PATENT DOCUMENTS

| | | | |
|---|---|---|---|
| CN | 106784015 A | 5/2017 | |
| CN | 106960881 A | 7/2017 | |
| CN | 107482064 A | 12/2017 | |
| CN | 110416316 A | 11/2019 | |
| CN | 111370496 A | 7/2020 | |

\* cited by examiner

THIN FILM TRANSISTOR AND METHOD FOR MANUFACTURING THE SAME, DISPLAY DEVICE

TECHNICAL FIELD

The present disclosure relates to the field of display technology, and in particular, to a thin film transistor, a method for manufacturing a thin film transistor, and a display device.

BACKGROUND

With the increasing demand for display types, flexible, foldable and stretchable displays become the trend of research and development. In these techniques, during a bending or stretching process of a display device, an active layer of a thin film transistor is easily broken, so that the thin film transistor is damaged, and finally, the display is abnormal.

SUMMARY

Embodiments of the disclosure provide a thin film transistor, a method for manufacturing a thin film transistor, and a display device.

As a first aspect of the present disclosure, there is provided a thin film transistor, including a first electrode, a second electrode, an active layer, and a flexible conductive layer located on a substrate, wherein, one of the first electrode and the second electrode is a source, and the other one of the first electrode and the second electrode is a drain;

the active layer is electrically coupled with the first electrode, and an orthographic projection of the active layer on the substrate is within an orthographic projection of the first electrode on the substrate;

the flexible conductive layer is located on a side of the active layer away from the first electrode, and electrically couples the active layer with the second electrode.

In some implementations, the thin film transistor further includes a gate and a gate insulating layer, the gate is located on a side, away from the active layer, of the flexible conductive layer, and the orthographic projection of the active layer on the substrate is within an orthographic projection of the gate on the substrate;

the gate insulating layer is located between the gate and the flexible conductive layer.

In some implementations, the gate is on a side of the active layer away from the substrate, the first electrode is located between the active layer and the substrate.

In some implementations, the first electrode is a drain, the first electrode includes a display electrode connecting portion, and an orthogonal projection of the display electrode connecting portion on the substrate does not overlap with the orthogonal projection of the active layer on the substrate, an orthogonal projection of the flexible conductive layer on the substrate, and the orthogonal projection of the gate on the substrate.

In some implementations, the gate is located between the active layer and the substrate, and the first electrode is on a side of the active layer away from the substrate.

In some implementations, the thin film transistor further includes a support, which is located in the same layer as the gate, and an orthographic projection of the support on the substrate overlaps an orthographic projection of the second electrode on the substrate.

In some implementations, the first electrode and the second electrode are located in a same layer with a space therebetween; and an organic filling layer is arranged in the space between the first electrode and the second electrode; or a hollow-out area is formed between the first electrode and the second electrode.

In some implementations, the active layer includes a first active sub-layer and a second active sub-layer which are stacked, the first active sub-layer is of a crystalline structure, the second active sub-layer is of an amorphous structure, and the first active sub-layer is located on a side, away from the substrate, of the second active sub-layer.

In some implementations, the flexible conductive layer includes any one of a metal nanowire layer, a carbon material layer, and an organic conductive material layer.

As a second aspect of the present disclosure, there is provided a display device, including the thin film transistor described above.

As a third aspect of the present disclosure, there is provided a method for manufacturing a thin film transistor, including:

forming a first electrode, a second electrode, an active layer and a flexible conductive layer of a thin film transistor on a substrate, where one of the first electrode and the second electrode is a source, and the other of the first electrode and the second electrode is a drain; the active layer is electrically coupled with the first electrode, and an orthographic projection of the active layer on the substrate is within an orthographic projection of the first electrode on the substrate; the flexible conductive layer is located on a side of the active layer away from the first electrode, and electrically couples the active layer with the second electrode.

In some implementations, the method further includes:

forming a gate of the thin film transistor, where the gate is located on a side of the flexible conductive layer away from the active layer, and the orthographic projection of the active layer on the substrate is within an orthographic projection of the gate on the substrate; and forming a gate insulating layer, where the gate insulating layer is located between the gate and the flexible conductive layer.

DRAWINGS

The accompanying drawings, which are included to provide a further understanding of the disclosure and are incorporated in and constitute a part of this specification, illustrate embodiments of the disclosure and together with the description serve to explain the disclosure, but do not constitute a limitation of the disclosure. In the drawings.

DETAILED DESCRIPTION

To make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few embodiments of the present disclosure, and not all embodiments. All other embodiments, which can be derived by a person skilled in the art from the described embodiments of the disclosure without creative effort, are within the protective scope of the present disclosure.

The terminology used herein to describe embodiments of the disclosure is not intended to limit and/or define the scope of the disclosure. For example, unless defined otherwise, technical or scientific terms used herein shall have the ordinary meaning as understood by one of ordinary skill in the art to which the present disclosure belongs. The use of "first", "second", and the like in the present disclosure is not intended to indicate any order, quantity, or importance, but rather is used to distinguish one element from another. Also, the use of the terms "a", "an" or "the" and similar referents does not denote a limitation of quantity, but rather denote the presence of at least one. The word "include", "comprise", or the like, means that the element or item preceding the word contains the element or item listed after the word and its equivalent, but does not exclude other elements or items. The terms "connected" or "coupled" and the like are not restricted to physical or mechanical connections, but may include electrical connections, whether direct or indirect. The word "upper", "lower", "left", "right", and the like are used only to indicate relative positional relationships, and when the absolute position of the object being described is changed, the relative positional relationships may also be changed accordingly.

In the following description, when an element or layer is referred to as being "on" or "coupled to" another element or layer, the element or layer may be directly on another element or layer, coupled to another element or layer, or intervening elements or layers may be present. However, when an element or layer is referred to as being "directly on" or "directly coupled to" another element or layer, there are no intervening elements or layers. The term "and/or" includes any and all combinations of one or more of the associated listed items.

Figure 1:
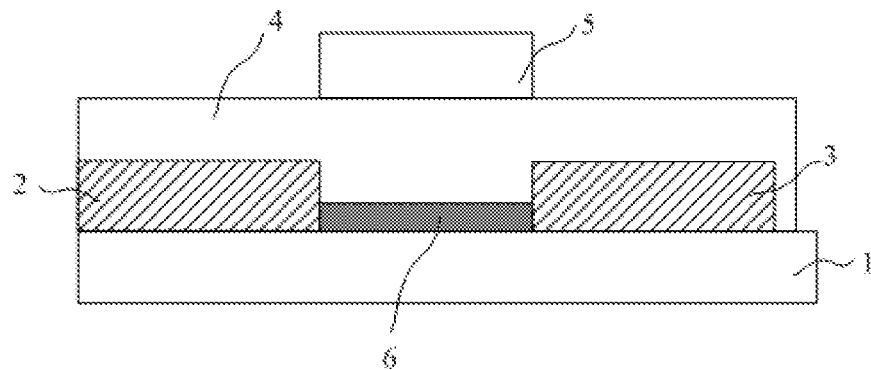
FIG. 1 is a schematic structural diagram of a thin film transistor in a comparative example.

FIG. 1 is a schematic structural diagram of a thin film transistor in a comparative example, as shown in FIG. 1, an active layer 6, a source 2, and a drain 3 of the thin film transistor are disposed on a substrate 1, an orthogonal projection of a gate 5 on the substrate 1 and an orthogonal projection of the active layer 6 on the substrate 1 at least partially overlap, and the gate 5 and the active layer 6 are insulated and spaced apart from each other by an insulating layer 4, and the source 2 and the drain 3 are respectively coupled to two ends of the active layer 6. When the thin film transistor shown in FIG. 1 is used in a flexible display product, since the active layer 6 has low flexibility, the active layer is easily broken during folding and stretching processes of the flexible display product so that the thin film transistor is damaged, which finally results in abnormal display.

Figure 2:
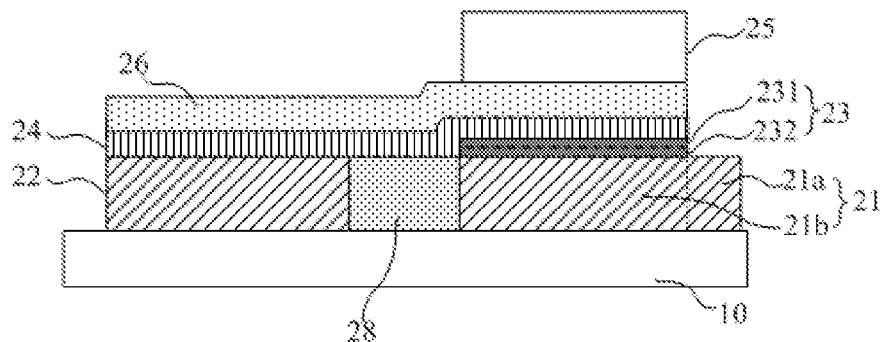
FIG. 2 is a schematic structural diagram of a thin film transistor according to some embodiments of the present disclosure.
Figure 3:
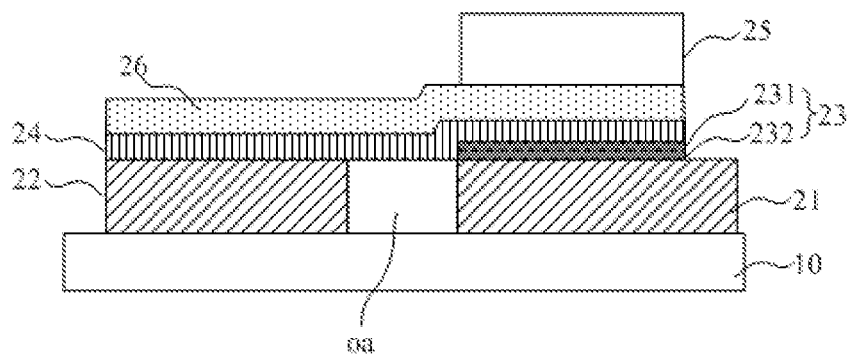
FIG. 3 is a schematic structural diagram of another thin film transistor according to some embodiments of the present disclosure.
Figure 4:
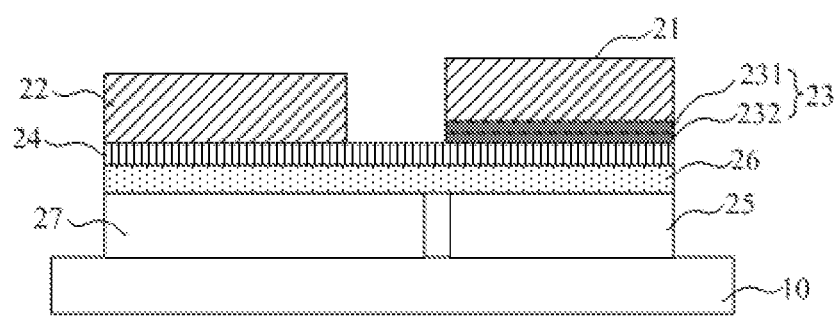
FIG. 4 is a schematic structural diagram of another thin film transistor provided in some embodiments of the present disclosure.
Figure 5:
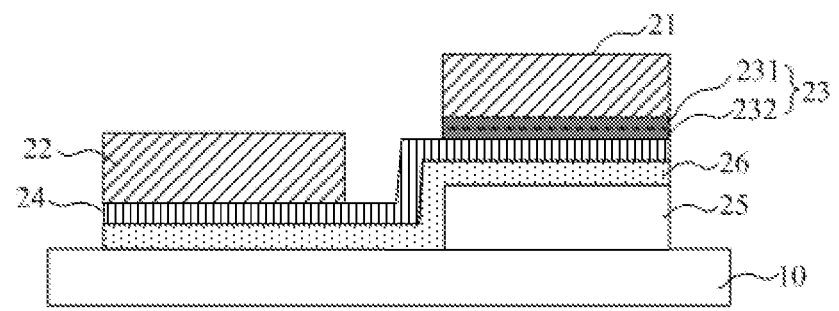
FIG. 5 is a schematic structural diagram of another thin film transistor provided in some embodiments of the present disclosure.

As a first aspect of the present disclosure, a thin film transistor is provided. FIG. 2 is a schematic structural diagram of a thin film transistor according to some embodiments of the present disclosure, FIG. 3 is a schematic structural diagram of another thin film transistor according to some embodiments of the present disclosure, FIG. 4 is a schematic structural diagram of another thin film transistor according to some embodiments of the present disclosure, and FIG. 5 is a schematic structural diagram of another thin film transistor according to some embodiments of the present disclosure, and as shown in FIGS. 2 to 5, the thin film transistor includes a first electrode 21, a second electrode 22, an active layer 23 and a flexible conductive layer 24 which are disposed on a substrate 10.

One of the first electrode 21 and the second electrode 22 is a source, and the other of the first electrode 21 and the second electrode 22 is a drain. The active layer 23 is electrically coupled to the first electrode 21, and an orthographic projection of the active layer 23 on the substrate 10 is located within an orthographic projection of the first electrode 21 on the substrate 10. The flexible conductive layer 24 is located on a side of the active layer 23 facing away from the first electrode 21 and electrically couples the active layer 23 with the second electrode 22.

It should be noted that, the orthographic projection of the active layer 23 on the substrate 10 being located within the orthographic projection of the first electrode 21 on the substrate 10 means that the orthographic projection of the active layer 23 on the substrate 10 does not exceed the orthographic projection of the first electrode 21 on the substrate 10. Specifically, the orthogonal projection of the active layer 23 on the substrate 10 may substantially coincide with the orthogonal projection of the first electrode 21 on the substrate 10; alternatively, the orthographic projection of the active layer 23 on the substrate 10 is smaller than the orthographic projection of the first electrode 21 on the substrate 10.

Alternatively, the substrate 10 is a flexible substrate 10, which may be made of a flexible organic material. The organic material is, for example, a resin material such as polyimide, polycarbonate, polyacrylate, polyetherimide, polyethersulfone, polyethylene terephthalate, or polyethylene naphthalate.

In the present disclosure, the orthographic projection of the active layer 23 on the substrate 10 is located within the orthographic projection of the first electrode 21 on the substrate 10, that is, the active layer 23 and the first electrode 21 are stacked, so that the bending capability at a position where the active layer 23 is located is improved, and when the thin film transistor provided by the embodiment of the present disclosure is used for a flexible display substrate, the occurrence of a fracture in the active layer 23 can be reduced or prevented, thereby improving the quality of the thin film transistor and ensuring the display effect of a display product.

In some implementations, as shown in FIGS. 2 to 5, the thin film transistor further includes a gate 25 and a gate insulating layer 26, the gate 25 is located on a side of the flexible conductive layer 24 facing away from the active layer 23, and the orthographic projection of the active layer 23 on the substrate 10 is located within an orthographic projection of the gate 25 on the substrate 10. For example, the orthogonal projection of the active layer 23 on the substrate 10 substantially coincides with the orthogonal projection of the gate 25 on the substrate 10. The gate insulating layer 26 is disposed between the gate 25 and the flexible conductive layer 24. When a voltage applied to the gate 25 reaches a predetermined value, a carrier channel is formed in the active layer 23, so that the first electrode 21 and the flexible conductive layer 24 are electrically coupled to allow a current therebetween, and the first electrode 21 and the second electrode 22 are electrically coupled to allow a current therebetween.

For example, the gate 25 may be a single layer film or a composite stack of one or more of a metal, an alloy, a conductive metal oxide, a transparent conductive material. The metal may be molybdenum (Mo), aluminum (Al), chromium (Cr), copper (Cu), titanium (Ti) and the like; the alloy may be copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), chromium molybdenum alloy (CrMo), chromium titanium alloy (CrTi), chromium molybdenum titanium alloy (CrMoTi), and the like. The transparent conductive material may be Indium Tin Oxide (ITO), Indium Zinc Oxide (IZO), Indium Gallium Oxide (IGO), Gallium Zinc Oxide (GZO), or the like. In some implementations, the gate 25 may be a single metal film layer made of Mo or Al, or a multi-layered metal thin film formed of Mo/Al/Mo or Ti/Al/Ti. The material of the gate 25 may be the same as or different from the material of the first electrode 21 and the second electrode 22. A thickness of the gate 25 may be between 100 nm and 600 nm.

For example, the gate insulating layer 26 may be made of an inorganic material, for example, the gate insulating layer 26 is a single layer film formed of one of silicon oxide (SiOx), silicon nitride (SiNx), silicon oxynitride (SiON), aluminum oxide (AlOx), and the like, or a composite film formed of a plurality of the above materials. In other specific examples, the gate insulating layer 26 may be made of an organic material with good bending performance, for example, the organic material includes resin materials such as polyimide, epoxy resin, acrylic, polyester, photoresist, polyacrylate, polyamide, and siloxane. As another example, the organic material includes an elastomeric material, such as, ethyl carbamate, thermoplastic polyurethane (TPU), and the like. A thickness of the gate insulating layer 26 may be between 50 nm and 1000 nm.

In some implementations, the first electrode 21 and the second electrode 22 may be disposed in a same layer and have a same material, and a space is formed between the first electrode 21 and the second electrode 22. It should be noted that "disposed in a same layer" in the embodiment of the present disclosure means that two structures are formed by a same material layer through a patterning process, and therefore, the two structures are located in the same layer in a layer-to-layer relationship, which does not mean that distances between the two structures and the substrate 10 must be the same.

In some implementations, the material of the first electrode 21 and the second electrode 22 may include a metal, an alloy, a conductive metal oxide, a transparent conductive material, or the like. For example, each of the first electrode 21 and the second electrode 22 may have a single-layered structure or a multiple-layered structure of metal, and for example, each of the first electrode 21 and the second electrode 22 may be a single-layered thin film made of copper (Cu), molybdenum (Mo), or aluminum (Al). For another example, the first electrode 21 and the second electrode 22 are each a multiple-layered thin film formed of Mo/Al/Mo or a Ti/Al/Ti. For another example, each of the first electrode 21 and the second electrode 22 is made of a transparent conductive material such as Indium Tin Oxide (ITO). In some specific examples, a thickness of the first electrode 21 and a thickness of the second electrode 22 are both between 100 nm and 600 nm.

In some implementations, the active layer 23 may be made of a polycrystalline silicon material, for example, a low temperature polysilicon material. Alternatively, the active layer 23 may be made of a metal oxide material, for example, an oxide material such as Indium Gallium Zinc Oxide (IGZO) or zinc oxide (ZnO). Still alternatively, the active layer 23 may also be made of an amorphous silicon material. In some specific examples, the active layer 23 has a thickness ranging from 10 nm to 100 nm.

In some implementations, the active layer 23 includes a first active sub-layer 231 and a second active sub-layer 232 which are stacked, the first active sub-layer 231 is in a crystalline structure, the second active sub-layer 232 is in an amorphous structure, and the first active sub-layer 231 is located on a side of the second active sub-layer 232 facing away from the substrate 10. The first active sub-layer 231 adopts the crystalline structure, so that damage to the active layer 23 caused by subsequent processes can be reduced or prevented; the second active sub-layer 232 adopting the amorphous structure may increase the carrier concentration in the active layer 23. Certainly, the active layer 23 as a whole may be of a crystalline structure or an amorphous structure.

In some implementations, the flexible conductive layer 24 may be a film that is electrically conductive and that is flexible and stretchable. Alternatively, the flexible conductive layer 24 may be a metal nanowire layer, for example, a nanowire layer of gold (Au), silver (Ag), copper (Cu), or the like. Alternatively, the flexible conductive layer 24 is a carbon material layer, such as a graphene layer, a carbon nanotube, or the like. Still alternatively, the flexible conductive layer 24 is an organic conductive material layer. A thickness of the flexible conductive layer 24 may be between 1 nm and 100 nm.

In a specific example, the first electrode 21, the second electrode 22 and the active layer 23 are all made of transparent materials, and the flexible conductive layer 24 is made of a transparent organic conductive material, or is a mesh structure layer made of metal nanowires, and then an overall transparency of the thin film transistor is relatively high, so that the thin film transistor can be used in a transparent display device.

In some implementations, the thin film transistor is of a top gate type structure, as shown in FIGS. 2 and 3, the gate 25 is located on a side of the active layer 23 facing away from the substrate 10, and the first electrode 21 is located between the active layer 23 and the substrate 10. The orthogonal projection of the gate 25 on the substrate 10 and the orthogonal projection of the active layer 23 on the substrate 10 may substantially coincide, or the orthogonal projection of the gate 25 on the substrate 10 exceeds the orthogonal projection of the active layer 23 on the substrate 10.

When the thin film transistor is used in a pixel region of the display substrate, the drain of the thin film transistor may be coupled to the display electrode, which may be an anode of a light emitting device (e.g., an organic light emitting diode OLED). In general, a layer where the anode of the light emitting device is located is located on a side of the thin film transistor away from the substrate 10, therefore, when the thin film transistor adopts the top gate type structure, at least a portion of the drain may be made to extend beyond the flexible conductive layer 24, facilitating coupling between the drain and the display electrode. Taking the first electrode 21 as the drain as an example, as shown in FIG. 2 and FIG. 3, the first electrode 21 includes a main body portion 21b and a display electrode connecting portion 21a located at a side of the main body portion 21b, the main body portion 21b is a portion of the first electrode 21 facing the active layer 23, an orthogonal projection of the display electrode connecting portion 21a on the substrate 10 does not overlap with the orthogonal projection of the active layer 23 on the substrate 10, and does not overlap with an orthogonal projection of the flexible conductive layer 24 on the substrate 10, and in addition, the orthogonal projection of the display electrode connecting portion 21a on the substrate 10 does not overlap with the orthogonal projection of the gate 25 on the substrate 10. In this case, when the thin film transistor is disposed in the pixel region, the display electrode may be coupled to the display electrode connection part 21a through a via hole.

When the thin film transistor is of a top gate structure, as shown in FIG. 2, an organic filling layer 28 may be disposed in the space between the first electrode 21 and the second electrode 22, so as to support the flexible conductive layer 24 to a certain extent. For example, the material of the organic filling layer 28 is a resin material such as polyimide, epoxy resin, acrylic, polyester, photoresist, polyacrylate, polyamide, siloxane, or the like. As another example, the material of the organic filling layer 28 is an organic material with good elasticity, such as ethyl carbamate, thermoplastic polyurethane (TPU) and the like. Certainly, no organic material may be filled between the first electrode 21 and the second electrode 22, so that a hollow area oa is formed between the first electrode 21 and the second electrode 22, as shown in FIG. 3.

In other implementations, the thin film transistor may also of a bottom gate structure. Specifically, as shown in FIGS. 4 and 5, the gate 25 is located between the active layer 23 and the substrate 10, and the first electrode 21 is located on a side of the active layer 23 facing away from the substrate 10.

In a specific example, as shown in FIG. 4, the thin film transistor may further include a support 27 arranged in the same layer as the gate 25, an orthogonal projection of the support 27 on the substrate 10 overlaps with an orthogonal projection of the second electrode 22 on the substrate 10, so that a height difference between an upper surface of the second electrode 22 and an upper surface of the first electrode 21 can be reduced to facilitate the arrangement of the flexible conductive layer 24.

In this case, the organic filling layer 28 may be provided between the first electrode 21 and the second electrode 22, or a hollow region may be formed between the first electrode 21 and the second electrode 22 without filling the space therebetween.

In another example, as shown in FIG. 5, the support 27 above-described may not be provided.

When the thin film transistor adopts the bottom gate type structure, since the first electrode 21 is located at a side of the active layer 23 facing away from the substrate 10, when the first electrode 21 is electrically coupled to the anode of the light emitting device, it is not affected by the active layer 23 or the flexible conductive layer 24, and thus, in this case, the orthographic projection of the first electrode 21 on the substrate 10 can substantially coincide with the orthographic projection of the active layer 23 on the substrate 10.

As a second aspect of the present disclosure, there is further provided a method for manufacturing a thin film transistor, the method including: forming a first electrode, a second electrode, an active layer and a flexible conductive layer of a thin film transistor on a substrate, where one of the first electrode and the second electrode is a source, and the other of the first electrode and the second electrode is a drain; the active layer is electrically coupled with the first electrode, and an orthographic projection of the active layer on the substrate is within an orthographic projection of the first electrode on the substrate; the flexible conductive layer is located on a side of the active layer away from the first electrode, and electrically couples the active layer with the second electrode.

According to the method for manufacturing the thin film transistor provided in the embodiment of the present disclosure, the orthographic projection of the active layer on the substrate is located within the orthographic projection of the first electrode on the substrate, so that the bending capability at the position where the active layer is located can be improved. When the thin film transistor manufactured by this method is used in the flexible display substrate, the fracture of the active layer can be reduced or prevented, so as to improve the quality of the thin film transistor and ensure the display effect of the display product.

In some implementations, the active layer includes a first active sub-layer and a second active sub-layer which are stacked, the first active sub-layer is of a crystalline structure, the second active sub-layer is of an amorphous structure, and the first active sub-layer is located between the second active sub-layer and the flexible conductive layer. The flexible conductive layer includes any one of a metal nanowire layer, a carbon material layer, and an organic conductive material layer.

In some implementations, the method further includes: forming a gate of the thin film transistor; and forming a gate insulating layer. The gate is located on a side, away from the active layer, of the flexible conductive layer, and the orthographic projection of the active layer on the substrate is within the orthographic projection of the gate on the substrate. The gate insulating layer is located between the gate and the flexible conductive layer. In some implementations, the gate insulating layer is made of an organic material with a relatively good bending performance; certainly, the gate insulating layer may also be made of an inorganic material.

In some implementations, the gate is formed after the active layer is formed, such that the gate is located on a side of the active layer facing away from the substrate; the first electrode is formed before the active layer is formed, so that the first electrode is located between the active layer and the substrate, thereby forming the thin film transistor of a top gate type structure.

In some implementations, the first electrode is a drain, the first electrode includes a display electrode connecting portion, and an orthographic projection of the display electrode connecting portion on the substrate does not overlap with each of the orthographic projection of the active layer on the substrate, an orthographic projection of the flexible conductive layer on the substrate, and the orthographic projection of the gate on the substrate.

In other embodiments, the gate is formed before the active layer is formed, such that the gate is located between the active layer and the substrate; and the first electrode is formed after the active layer is formed, so that the first electrode is located on a side of the active layer away from the substrate, thereby forming the thin film transistor of a bottom gate structure. In some implementations, the method further includes: forming a support synchronously with the gate, where an orthographic projection of the support on the substrate overlaps an orthographic projection of the second electrode on the substrate.

Figure 6:
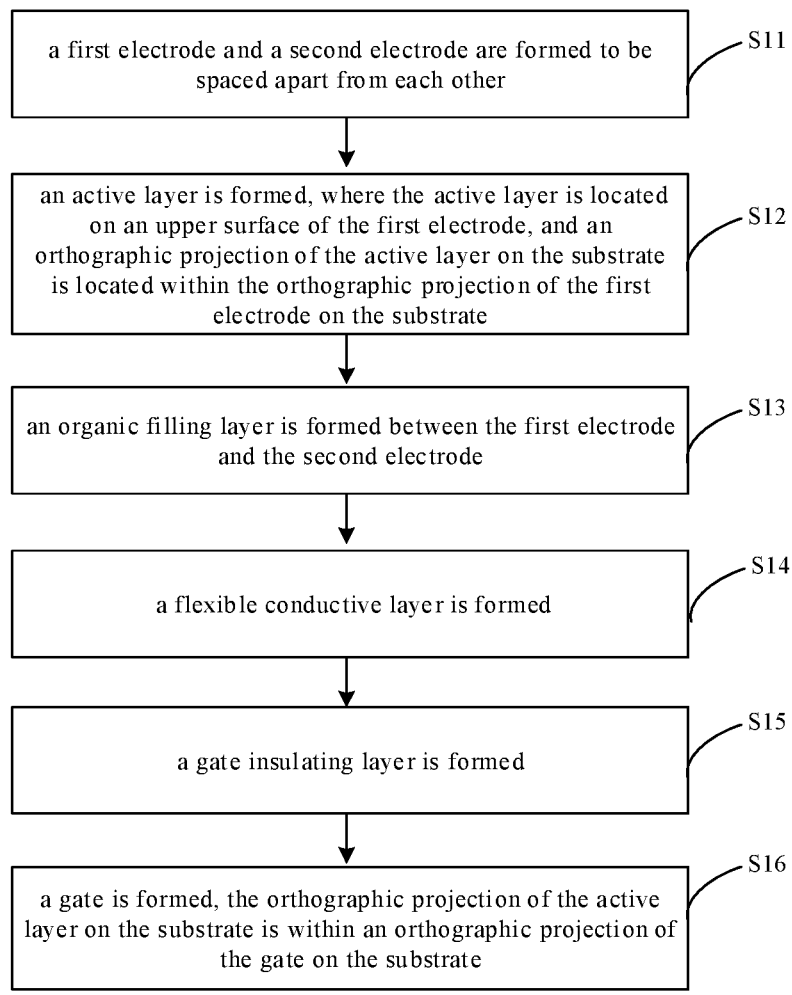
FIG. 6 is a flow chart of a method for manufacturing a thin film transistor according to some embodiments of the present disclosure.

FIG. 6 is a flowchart of a method for manufacturing the thin film transistor provided in some embodiments of the present disclosure, and FIGS. 7A to 7G are schematic diagrams illustrating steps of the method for manufacturing the thin film transistor provided in some embodiments of the present disclosure. The method for manufacturing the thin film transistor is described below with reference to FIGS. 6 to 7G.

Figure 7A:
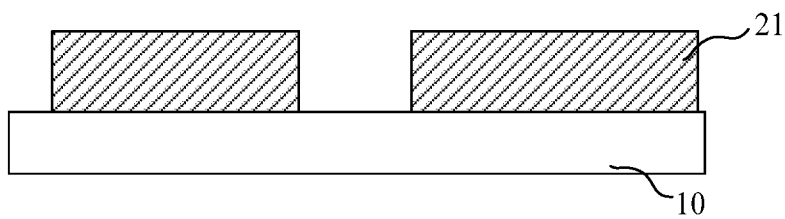
FIG. 7A to 7G are schematic diagrams illustrating steps of a method for manufacturing a thin film transistor according to some embodiments of the present disclosure.

In step S11, as shown in FIG. 7A, a first electrode 21 and a second electrode 22 are formed to be spaced apart from each other.

In some implementations, a source-drain material layer is formed on the substrate 10, and a patterning process is performed on the source-drain metal layer to form the first electrode 21 and the second electrode 22 which are spaced apart from each other. The source-drain material layer may be formed by adopting a physical vapor deposition method such as magnetron sputtering and the like. The source-drain material layer may be a single-layered film or a composite laminated layer formed by one or more of metal, alloy, conductive metal oxide, and transparent conductive material. The metal may be molybdenum (Mo), aluminum (Al), chromium (Cr), copper (Cu), titanium (Ti) and the like; the alloy may be copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), chromium molybdenum alloy (CrMo), chromium titanium alloy (CrTi), chromium molybdenum titanium alloy (CrMoTi), and the like. The transparent conductive material may be Indium Tin Oxide (ITO), Indium Zinc Oxide (IZO), Indium Gallium Oxide (IGO), Gallium Zinc Oxide (GZO), or the like. In some specific examples, the source-drain material layer may be a single-layered metal film made of Mo or Al, or a multiple-layered metal film formed of Mo/Al/Mo or Ti/Al/Ti. A thickness of the source-drain material layer is between 100 nm and 600 nm. The patterning process may be a photolithography patterning process, and specifically may include: photoresist coating, exposure, development, etching, photoresist stripping and the like.

Figure 7B:
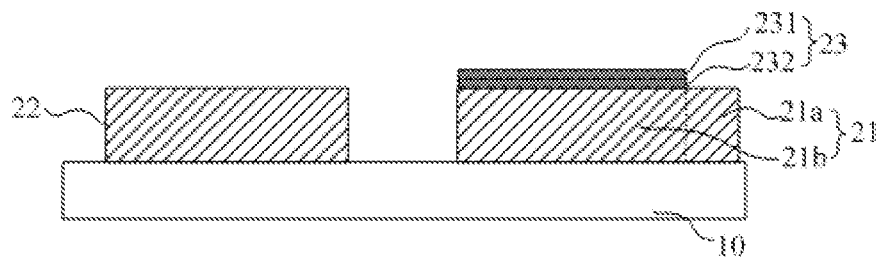

In step S12, as shown in FIG. 7B, an active layer 23 is formed, where the active layer 23 is located on an upper surface of the first electrode 21, and an orthographic projection of the active layer 23 on the substrate 10 is located within the orthographic projection of the first electrode 21 on the substrate 10.

The material for forming the active layer 23 may include polycrystalline silicon, amorphous silicon, or metal oxide, and the like. In a specific example, the material of the active layer 23 may be a metal oxide, such as IGZO.

For example, the active layer 23 may be obtained by depositing an oxide semiconductor film on a surface of the substrate by using a sputtering, thermal evaporation, Plasma Enhanced Chemical Vapor Deposition (PECVD), Low Pressure Chemical Vapor Deposition (LPCVD), Atmospheric Pressure Chemical Vapor Deposition (APCVD), or electron cyclotron resonance chemical vapor deposition (ECR-CVD) process, and patterning the oxide semiconductor film by using a photolithography patterning process.

In some implementations, the active layer 23 includes a first active sub-layer 231 and a second active sub-layer 232, the first active sub-layer 231 has a crystalline structure, the second active sub-layer 232 has an amorphous structure, and the first active sub-layer 231 is located on a side of the second active sub-layer 232 facing away from the substrate 10. In this case, the semiconductor film layer having the amorphous structure may be formed first, then the semiconductor film layer having the crystalline structure may be formed, and then the patterning process may be performed on such two semiconductor film layer simultaneously, thereby forming the first active sub-layer 231 and the second active sub-layer 232.

Figure 7C:
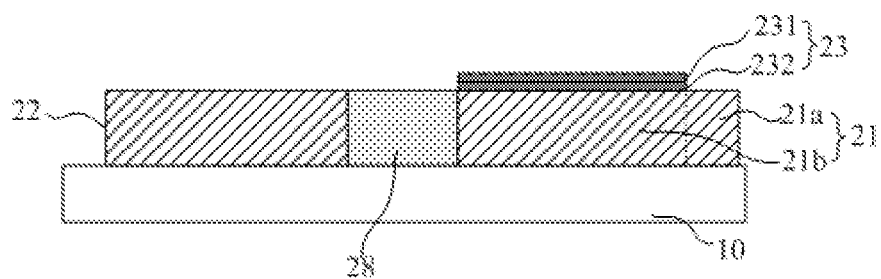

In step S13, as shown in FIG. 7C, an organic filling layer 28 is formed between the first electrode 21 and the second electrode 22 to fill the space between the first electrode 21 and the second electrode 22. The organic filling layer 28 can support the flexible conductive layer 24 subsequently formed. The material of the organic filling layer 28 may be selected from resin materials such as polyimide, epoxy resin, acrylic, polyester, photoresist, polyacrylate, polyamide, siloxane, and the like. As another example, the material of the organic filling layer 28 may be organic materials with good elasticity, such as ethyl carbamate, thermoplastic polyurethane (TPU) and the like. When the organic filling layer 28 is formed, an organic material layer may be formed first, so that the organic material layer is filled in the space between the first electrode 21 and the second electrode 22, and then a patterning process is performed on the organic material layer, the organic material in the space between the first electrode 21 and the second electrode 22 is remained, and the organic material in other portions is removed.

Certainly, the step S13 may not be performed, and a hollow is formed between the first electrode 21 and the second electrode 22.

Figure 7D:
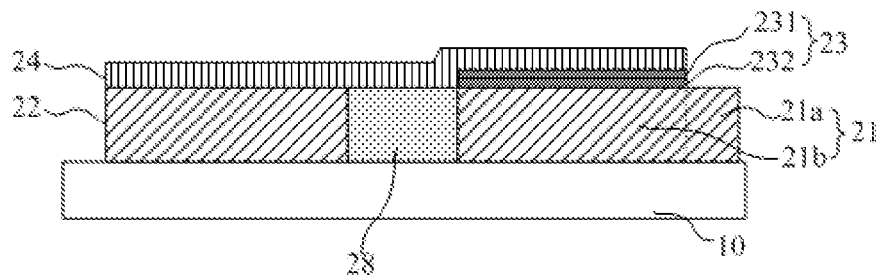

In step S14, as shown in FIG. 7D, a flexible conductive layer 24 is formed, one end of the flexible conductive layer 24 is located on an upper surface of the active layer 23, and the other end is located on an upper surface of the second electrode 22, thereby electrically coupling the active layer 23 and the second electrode 22.

Figure 7E:
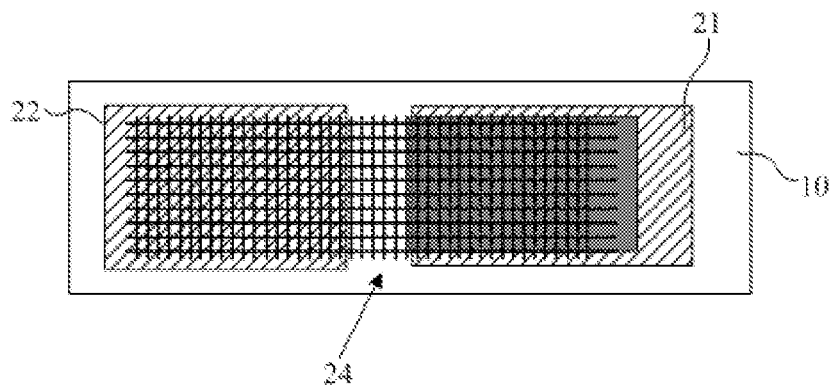

Alternatively, a flexible conductive material layer is formed and a patterning process is performed on the flexible conductive material layer, thereby forming the flexible conductive layer 24. In a specific example, the flexible conductive material layer may be a metal nanowire layer, such as a nanowire layer made of gold (Au), silver (Ag), copper (Cu), or the like. FIG. 7E is a top view of the flexible conductive layer formed by using the metal nanowires, and as shown in FIG. 7E, the flexible conductive layer 24 is of a mesh structure formed by the metal nanowires, so that the light transmittance of the flexible conductive layer 24 can be improved, and the thin film transistor can be used in a transparent display product.

In another specific example, the flexible conductive material layer is a carbon material layer, such as a graphene layer, a carbon nanotube, or the like. Still alternatively, the flexible conductive material layer is an organic conductive material layer.

Figure 7F:
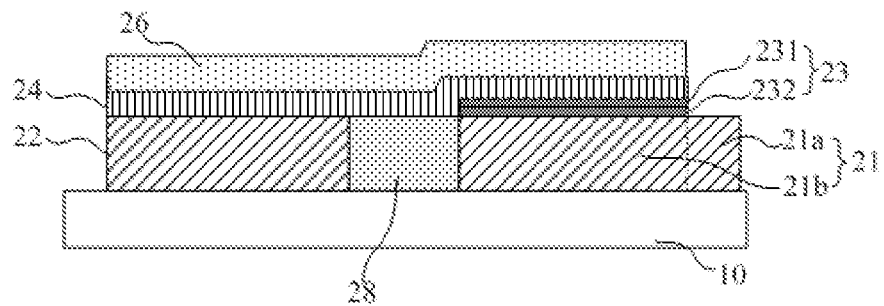

In step S15, as shown in FIG. 7F, a gate insulating layer 26 is formed. For example, the gate insulating layer 26 may be formed by a PECVD method, and may have a thickness ranging from 50 nm to 1000 nm. In some examples, the gate insulating layer 26 is a single-layered film formed of one of silicon oxide (SiOx), silicon nitride (SiNx), silicon oxynitride (SiON), aluminum oxide (AlOx), and the like, or may be a composite film layer formed of a plurality of materials of those described above. In other specific examples, the gate insulating layer 26 may be made of an organic material with good bending performance, for example, the organic material includes resin materials such as polyimide, epoxy resin, acrylic, polyester, photoresist, polyacrylate, polyamide, and siloxane. As another example, the organic material includes an elastomeric material, such as, ethyl carbamate, thermoplastic polyurethane (TPU), and the like.

Figure 7G:
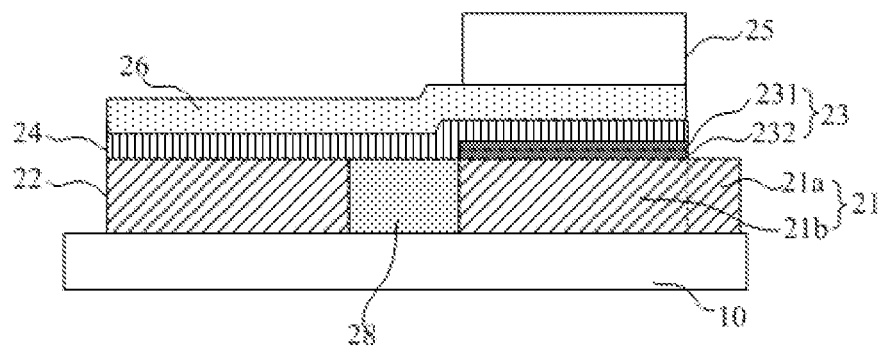

In step S16, as shown in FIG. 7G, a gate 25 is formed, where the gate 25 is located on a side of the active layer 23 away from the substrate 10, and an orthographic projection of the active layer 23 on the substrate 10 is within an orthographic projection of the gate 25 on the substrate 10.

In some implementations, a gate material layer is formed by a physical vapor deposition method such as magnetron sputtering, and a patterning process is performed on the gate material layer to form the gate 25. The gate material layer may be a single-layered film or a composite laminated film of one or more of a metal, an alloy, a conductive metal oxide, a transparent conductive material. The metal may be molybdenum (Mo), aluminum (Al), chromium (Cr), copper (Cu), titanium (Ti) and the like; the alloy may be copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), chromium molybdenum alloy (CrMo), chromium titanium alloy (CrTi), chromium molybdenum titanium alloy (CrMoTi), and the like. The transparent conductive material may be Indium Tin Oxide (ITO), Indium Zinc Oxide (IZO), Indium Gallium Oxide (IGO), Gallium Zinc Oxide (GZO), or the like. In some examples, the gate material layer may be a single-layered metal film made of Mo or Al, alternatively, may be a multiple-layered metal film formed of Mo/Al/Mo or Ti/Al/Ti. A thickness of the gate material layer is between 100 nm and 600 nm. The gate material layer may be made of a material the same as that of the source-drain material layer.

In some implementations, the first electrode 21 is a drain and includes a display electrode connecting portion 21a and a main body portion 21b, and an orthogonal projection of the display electrode connecting portion 21a on the substrate 10 does not overlap with each of the orthogonal projection of the active layer 23 on the substrate 10, an orthogonal projection of the flexible conductive layer 24 on the substrate 10, and the orthogonal projection of the gate 25 on the substrate 10.

Figure 8:
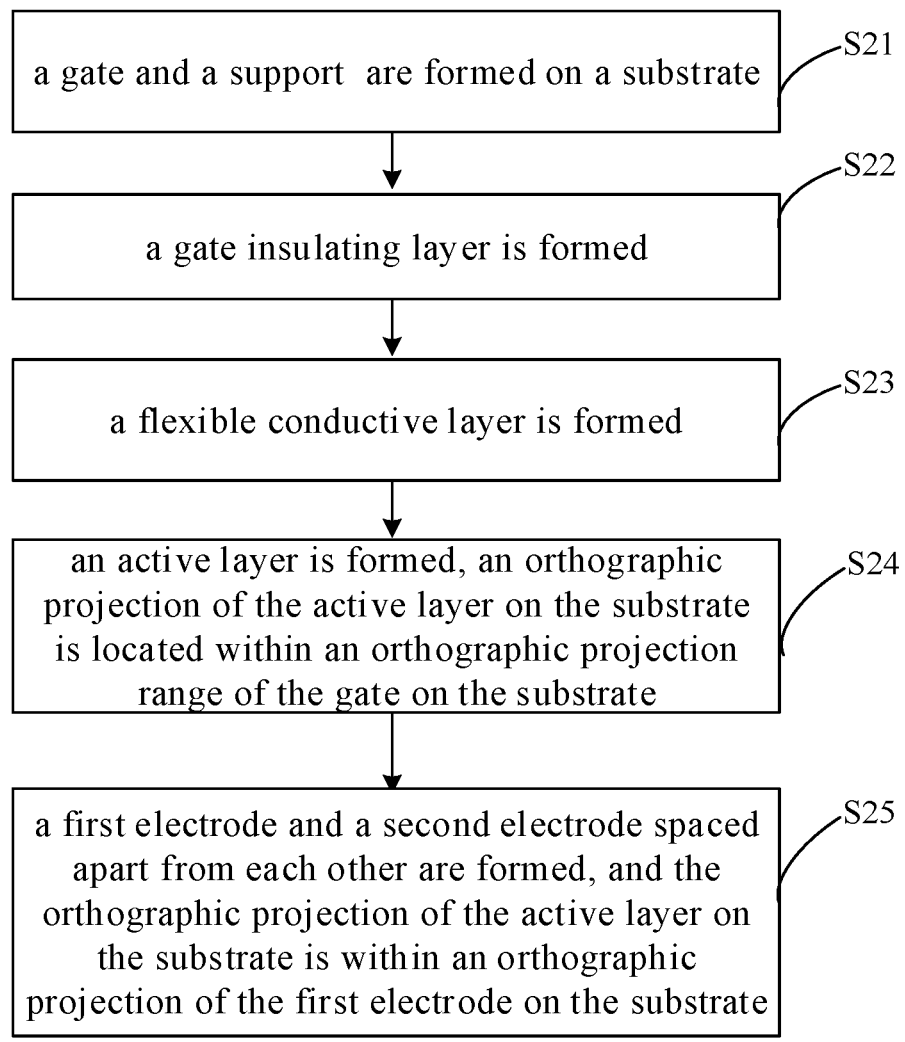
FIG. 8 is a flow chart of another method for manufacturing a thin film transistor according to some embodiments of the present disclosure.

FIG. 8 is a flowchart of another method for manufacturing the thin film transistor provided in some embodiments of the present disclosure, and FIGS. 9A to 9E are schematic diagrams illustrating steps of another method for manufacturing the thin film transistor provided in some embodiments of the present disclosure. The method for manufacturing the thin film transistor is described with reference to FIGS. 8 to 9E.

Figure 9A:
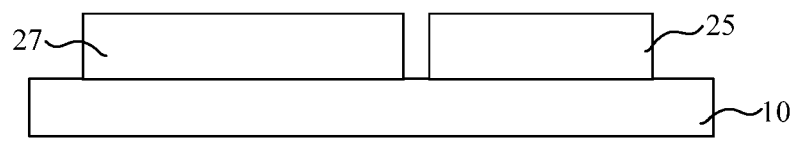
FIG. 9A to 9E are schematic diagrams illustrating steps of another method for manufacturing a thin film transistor according to some embodiments of the present disclosure.

In step S21, as shown in FIG. 9A, a gate 25 and a support 27 are formed on a substrate 10.

For example, a gate material layer is formed on the substrate 10 by a physical vapor deposition method such as magnetron sputtering, and a patterning process is performed on the gate material layer to form the gate 25 and the support 27.

Figure 9B:
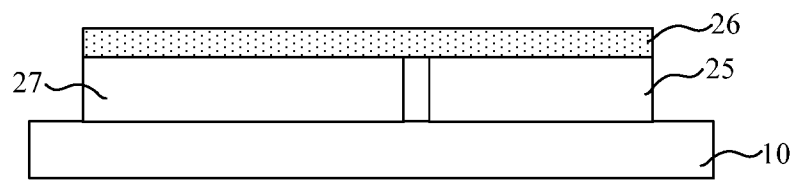

In step S22, as shown in FIG. 9B, a gate insulating layer 26 is formed. The specific material of the gate insulating layer 26 may be referred to the description of the above embodiments, and is not described herein again.

Figure 9C:
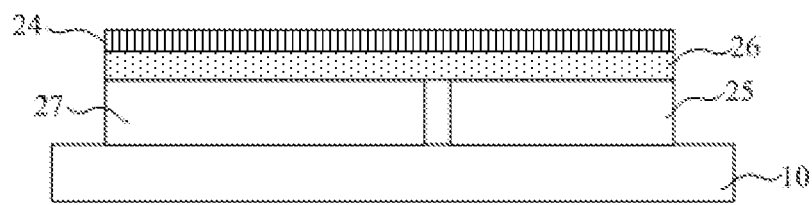

In step S23, as shown in FIG. 9C, a flexible conductive layer 24 is formed. For example, a flexible conductive material layer is formed, and a patterning process is performed on the flexible conductive material layer, thereby forming the flexible conductive layer 24.

Figure 9D:
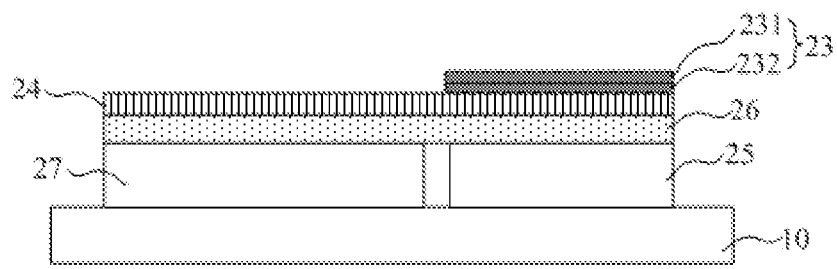

In step S24, as shown in FIG. 9D, an active layer 23 is formed, an orthographic projection of the active layer 23 on the substrate 10 is located within an orthographic projection of the gate 25 on the substrate 10. The active layer 23 is formed by performing a patterning process on a semiconductor layer, and the specific material of the semiconductor layer may be referred to the description in the above embodiments, which is not described herein again. In addition, the active layer 23 may adopt the structure including the first active sub-layer 231 and the second active sub-layer 232 described in the above embodiments.

Figure 9E:
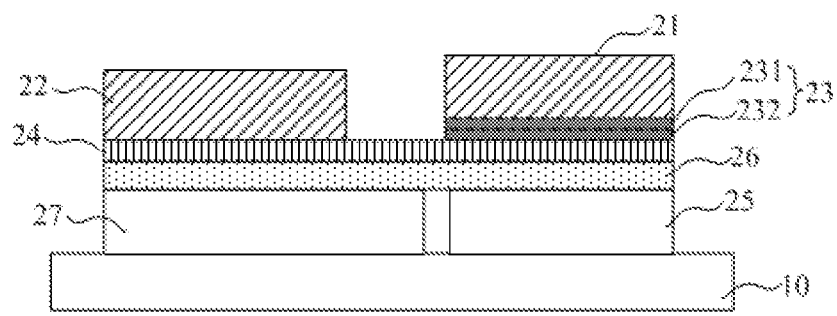

In step S25, as shown in FIG. 9E, a first electrode 21 and a second electrode 22 spaced apart from each other are formed, and the orthographic projection of the active layer 23 on the substrate 10 is within an orthographic projection of the first electrode 21 on the substrate 10. The first electrode 21 and the second electrode 22 are formed by performing a patterning process on a source-drain material layer.

Alternatively, in step S21, the support 27 may not be formed.

After step S25, an organic filling layer 28 may be formed in the space between the first electrode 21 and the second electrode 22. Certainly, the organic filling layer 28 may not be formed.

The specific materials and thicknesses of the gate material layer, the flexible conductive material layer, and the source-drain material layer may be referred to the description of the above embodiments, and are not described herein again.

As a third aspect of the present disclosure, there is further provided a display device including the thin film transistor in any one of the embodiments described above. The display device may be any product or component with a display function, such as an OLED panel, a mobile phone, a tablet personal computer, a television, a display, a notebook computer, a digital photo frame, a navigator and the like.

In some implementations, the display device may be a flexible display device. A plurality of gate lines and a plurality of data lines are arranged in a display region of the display device, and the gate lines and the data lines are intersected, thereby defining a plurality of pixel regions. Each pixel region is provided with a thin film transistor and a display electrode, the display electrode may be a pixel electrode or an anode of a light emitting device, and the light emitting device may be an organic light emitting diode (OLED).

Figure 10:
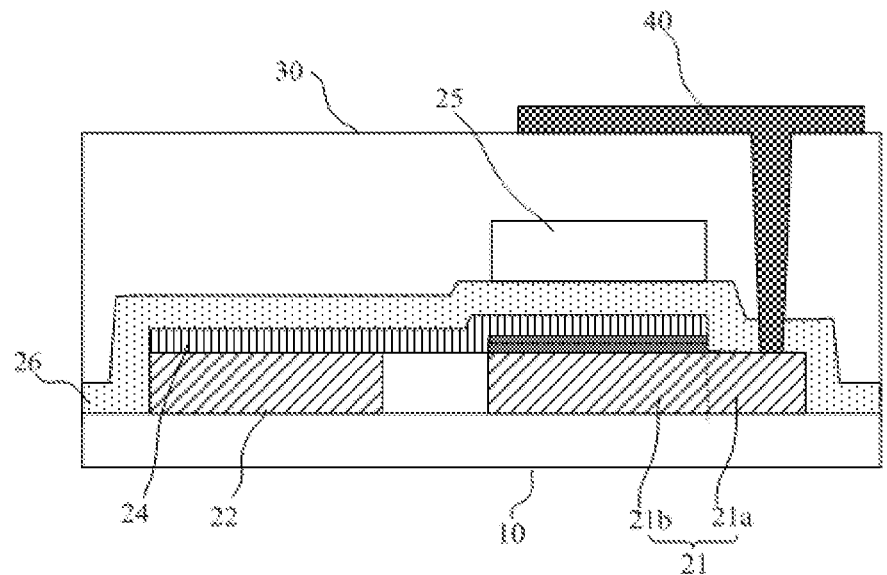
FIG. 10 is a schematic diagram of a connection between a thin film transistor and a display electrode according to some embodiments of the present disclosure.
Figure 11:
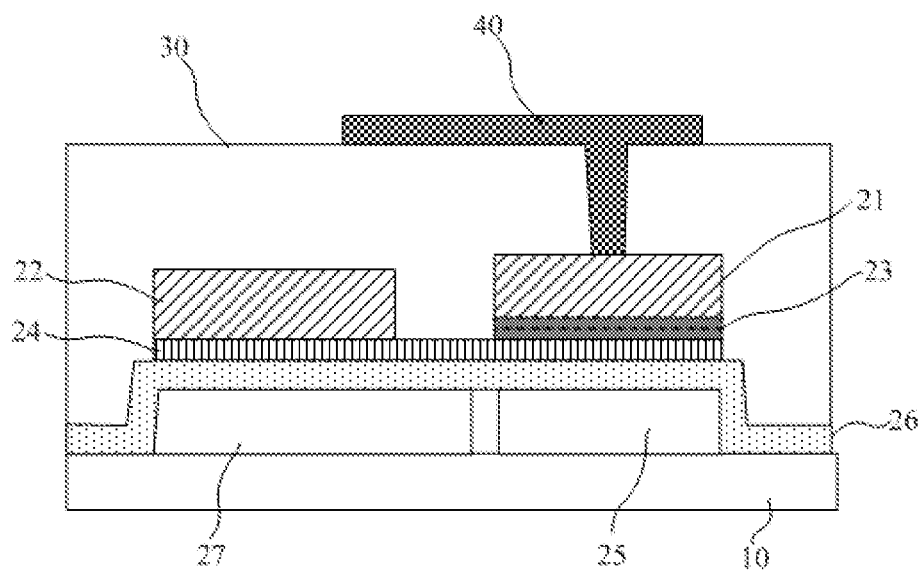
FIG. 11 is a schematic diagram of a connection between a thin film transistor and a display electrode according to some embodiments of the present disclosure.

FIG. 10 is a schematic diagram of connection between a thin film transistor and a display electrode provided in some embodiments of the present disclosure, and FIG. 11 is a schematic diagram of connection between a thin film transistor and a display electrode provided in some embodiments of the present disclosure. FIGS. 10 and 11 each schematically illustrate the first electrode as a drain. As shown in FIGS. 10 and 11, a planarization layer 30 is provided between the thin film transistor and the display electrode 40, and when the thin film transistor adopts a top gate type structure, as shown in FIG. 10, the display electrode 40 is coupled to the display electrode connecting portion 21a of the first electrode 21 through a via hole penetrating through the planarization layer 30 and the gate insulating layer 26; when the thin film transistor adopts a bottom gate type structure, as shown in FIG. 11, the display electrode 40 is coupled to the first electrode 21 through a via hole penetrating through the planarization layer 30.

In the display device provided by the embodiment of the disclosure, since the orthographic projection of the active layer of the thin film transistor on the substrate is within the orthographic projection of the first electrode on the substrate, the bending capability at the position of the active layer can be improved, so that the occurrence of a fracture in the active layer can be reduced or prevented, thereby improving the quality of the thin film transistor and ensuring the display effect of a display product.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

The invention claimed is:

1. A thin film transistor, comprising a first electrode, a second electrode, an active layer, a gate and a gate insulating layer, and a flexible conductive layer located on a substrate, wherein,
   one of the first electrode and the second electrode is a source, and the other of the first electrode and the second electrode is a drain;
   the active layer is electrically coupled with the first electrode, and an orthographic projection of the active layer on the substrate is within an orthographic projection of the first electrode on the substrate;
   the flexible conductive layer is located on a side of the active layer away from the first electrode, and electrically couples the active layer with the second electrode, the gate is located on a side, away from the active layer, of the flexible conductive layer, and the orthographic projection of the active layer on the substrate is within an orthographic projection of the gate on the substrate;
   the gate insulating layer is located between the gate and the flexible conductive layer;
   the first electrode and the second electrode are located in a same layer with a space therebetween; and
   an organic filling layer is arranged in the space between the first electrode and the second electrode; or a hollow area is formed between the first electrode and the second electrode.

2. The thin film transistor of claim 1, wherein the gate is located on a side of the active layer away from the substrate, the first electrode is located between the active layer and the substrate.

3. The thin film transistor of claim 2, wherein the first electrode is a drain, the first electrode comprises a display electrode connecting portion, and an orthogonal projection of the display electrode connecting portion on the substrate does not overlap with the orthogonal projection of the active layer on the substrate, an orthogonal projection of the flexible conductive layer on the substrate, and the orthogonal projection of the gate on the substrate.

4. The thin film transistor of claim 3, wherein the active layer comprises a first active sub-layer and a second active sub-layer which are stacked, the first active sub-layer is of a crystalline structure, the second active sub-layer is of an amorphous structure, and the first active sub-layer is located on a side, away from the substrate, of the second active sub-layer.

5. The thin film transistor of claim 2, wherein the active layer comprises a first active sub-layer and a second active sub-layer which are stacked, the first active sub-layer is of a crystalline structure, the second active sub-layer is of an amorphous structure, and the first active sub-layer is located on a side, away from the substrate, of the second active sub-layer.

6. The thin film transistor of claim 2, wherein the flexible conductive layer comprises any one of a metal nanowire layer, a carbon material layer, and an organic conductive material layer.

7. The thin film transistor of claim 1, wherein the gate is located between the active layer and the substrate, and the first electrode is on a side of the active layer away from the substrate.

8. The thin film transistor of claim 7, further comprising a support, which is located in the same layer as the gate, and an orthographic projection of the support on the substrate overlaps an orthographic projection of the second electrode on the substrate.

9. The thin film transistor of claim 1, wherein the active layer comprises a first active sub-layer and a second active sub-layer which are stacked, the first active sub-layer is of a crystalline structure, the second active sub-layer is of an amorphous structure, and the first active sub-layer is located on a side, away from the substrate, of the second active sub-layer.

10. The thin film transistor of claim 1, wherein the flexible conductive layer comprises any one of a metal nanowire layer, a carbon material layer, and an organic conductive material layer.

11. A display device, comprising the thin film transistor of claim 1.

12. The thin film transistor of claim 1, wherein the active layer comprises a first active sub-layer and a second active sub-layer which are stacked, the first active sub-layer is of a crystalline structure, the second active sub-layer is of an amorphous structure, and the first active sub-layer is located on a side, away from the substrate, of the second active sub-layer.

13. The thin film transistor of claim 1, wherein the flexible conductive layer comprises any one of a metal nanowire layer, a carbon material layer, and an organic conductive material layer.

14. A method for manufacturing a thin film transistor, comprising:
   forming a first electrode, a second electrode, an active layer, a gate and a gate insulating layer, and a flexible conductive layer of a thin film transistor on a substrate, wherein one of the first electrode and the second electrode is a source, and the other of the first electrode and the second electrode is a drain; the active layer is electrically coupled with the first electrode, and an orthographic projection of the active layer on the substrate is within an orthographic projection of the first electrode on the substrate; the flexible conductive layer is located on a side of the active layer away from the first electrode, and electrically couples the active layer with the second electrode, the gate is located on a side, away from the active layer, of the flexible conductive layer, and the orthographic projection of the active layer on the substrate is within an orthographic projection of the gate on the substrate;

the gate insulating layer is located between the gate and the flexible conductive layer;

the first electrode and the second electrode are located in a same layer with a space therebetween; and an organic filling layer is arranged in the space between the first electrode and the second electrode; or a hollow area is formed between the first electrode and the second electrode.

\* \* \* \* \*